(12) United States Patent
Chida et al.

(10) Patent No.: US 8,044,499 B2
(45) Date of Patent: Oct. 25, 2011

(54) WIRING SUBSTRATE, MANUFACTURING METHOD THEREOF, SEMICONDUCTOR DEVICE, AND MANUFACTURING METHOD THEREOF

(75) Inventors: Akihiro Chida, Atsugi (JP); Tomoyuki Aoki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 175 days.

(21) Appl. No.: 12/465,703

(22) Filed: May 14, 2009

(65) Prior Publication Data

US 2009/0302457 A1    Dec. 10, 2009

(30) Foreign Application Priority Data

Jun. 10, 2008    (JP) ................................. 2008-151227

(51) Int. Cl.
*H01L 23/48*    (2006.01)
*H01L 21/00*    (2006.01)

(52) U.S. Cl. ......... 257/690; 257/E23.003; 257/E21.505; 438/125

(58) Field of Classification Search .................. 257/702, 257/E23.003, E21.505, 678, 690, 789; 427/118; 438/125

See application file for complete search history.

(56) References Cited

U.S. PATENT DOCUMENTS

| | | | |
|---|---|---|---|
| 6,096,411 A * | 8/2000 | Nakatani et al. | 428/209 |
| 6,224,965 B1 | 5/2001 | Haas et al. | |
| 6,403,221 B1 | 6/2002 | Nakamura et al. | |
| 6,903,377 B2 | 6/2005 | Yamazaki et al. | |
| 7,049,178 B2 | 5/2006 | Kim et al. | |
| 7,262,464 B2 | 8/2007 | Takafuji et al. | |
| 7,485,489 B2 | 2/2009 | Björbell | |
| 7,736,958 B2 | 6/2010 | Dozen et al. | |
| 2002/0195634 A1 * | 12/2002 | Koyama et al. | 257/296 |
| 2003/0032210 A1 | 2/2003 | Takayama et al. | |
| 2005/0112798 A1 * | 5/2005 | Bjorbell | 438/106 |
| 2005/0218503 A1 * | 10/2005 | Abe et al. | 257/700 |
| 2005/0233122 A1 | 10/2005 | Nishimura et al. | |
| 2007/0146566 A1 | 6/2007 | Hosoya | |
| 2008/0044940 A1 | 2/2008 | Watanabe et al. | |
| 2008/0083954 A1 | 4/2008 | Tokunaga | |

(Continued)

FOREIGN PATENT DOCUMENTS

EP    1092739    4/2001

(Continued)

OTHER PUBLICATIONS

Search Report (Application No. 08003899.5) Dated Apr. 6, 2009.

(Continued)

*Primary Examiner* — Thomas L Dickey
*Assistant Examiner* — Nikolay Yushin
(74) *Attorney, Agent, or Firm* — Eric J. Robinson; Robinson Intellectual Property Law Office, P.C.

(57) ABSTRACT

A wiring substrate is provided, including an insulating resin layer which is provided on both surfaces of a sheet-like fibrous body and with which the sheet-like fibrous body is impregnated, and a through wiring provided in a region surrounded by the insulating resin layer. The through wiring is formed using a conductive material, the conductive material is exposed on both surfaces of the insulating resin layer, the sheet-like fibrous body is positioned in the conductive material, and the sheet-like fibrous body is impregnated with the conductive material. A manufacturing method of the wiring substrate is also provided.

20 Claims, 7 Drawing Sheets

U.S. PATENT DOCUMENTS

| | | |
|---|---|---|
| 2008/0224941 A1 | 9/2008 | Sugiyama et al. |
| 2009/0278252 A1 | 11/2009 | Oikawa et al. |
| 2009/0314527 A1 | 12/2009 | Hatano et al. |

FOREIGN PATENT DOCUMENTS

| | | |
|---|---|---|
| EP | 1589797 | 10/2005 |
| JP | 10-092980 | 4/1998 |
| JP | 2007-091822 | 4/2007 |
| JP | 2008-112988 | 5/2008 |
| WO | WO 01/01740 | 1/2001 |
| WO | WO 2004/001848 | 12/2003 |
| WO | WO 2008/041716 | 4/2008 |

OTHER PUBLICATIONS

Search Report (Application No. 08004496.9) Dated Apr. 14, 2009.
Search Report (Application No. 08003900.1) Dated Apr. 8, 2009.

* cited by examiner

WIRING SUBSTRATE, MANUFACTURING METHOD THEREOF, SEMICONDUCTOR DEVICE, AND MANUFACTURING METHOD THEREOF

BACKGROUND OF THE INVENTION

1. Field of the Invention

The present invention relates to a wiring substrate which electrically or mechanically connects a semiconductor integrated circuit or a circuit substrate, and a semiconductor device using the wiring substrate.

2. Description of the Related Art

Prepreg in which a sheet-like fibrous body as a reinforcing material is impregnated with a thermosetting resin and the thermosetting resin is made in a semi-cured state has been used as a member of a circuit substrate and the like. For example, prepreg is known in which a conductor passes through an insulating layer and which is formed by opening a through hole in a predetermined position and filling the through hole with a conductive paste to become the conductor by hot pressing (see Patent Document 1). In this case, the through hole is opened in the prepreg by a laser, a drill, a punching machine, or the like.

Further, prepreg used as a sealing material of a semiconductor device is disclosed (see Patent Document 2).

REFERENCES

Patent Document

[Patent Document 1] Japanese Published Patent Application No. 2007-091822
[Patent Document 2] Japanese Published Patent Application No. 2008-112988

SUMMARY OF THE INVENTION

However, formation of a through hole in a composite substrate, such as prepreg, in which a fibrous body is impregnated with a resin (hereinafter also referred to as a resin-impregnated fibrous-body composite substrate), damages a sheet-like fibrous body as a reinforcing material, whereby the strength of the resin-impregnated fibrous-body composite substrate is decreased. In the case of using the resin-impregnated fibrous-body composite substrate as a sealing body, if a through hole is opened in the sealing body for formation of a through wiring, airtightness cannot be maintained, and thus the resin-impregnated fibrous-body composite substrate cannot function as the sealing material. Further, since an opening has to be formed in both the sheet-like fibrous body and the resin layer, there is a problem in that the number of manufacturing steps is increased.

In view of the foregoing problems, it is an object of the present invention to provide a conductive pattern which penetrates a resin-impregnated fibrous-body composite substrate while maintaining the strength of the sheet-like fibrous body. It is another object to use the resin-impregnated fibrous-body composite substrate provided with the penetrating conductive pattern as a sealing body of a semiconductor device.

One embodiment of the present invention is a wiring substrate including an insulating resin layer which is provided on both surfaces of a sheet-like fibrous body and with which the sheet-like fibrous body is impregnated, and a through wiring provided in a region surrounded by the insulating resin layer. This through wiring is formed using a conductive material, the conductive material is exposed on both surfaces of the insulating resin layer, the conductive material penetrates the sheet-like fibrous body so that a portion of the sheet-like fibrous body is positioned in the conductive material, and the sheet-like fibrous body is impregnated with the conductive material. By impregnation of the sheet-like fibrous body with the conductive material, electrical connection between the front and rear sides of the insulating resin layer can be realized. In this case, since the sheet-like fibrous body remains in an entire region of the wiring substrate without any portion being removed, the sheet-like fibrous body serves as a reinforcing material.

Another embodiment of the present invention is a semiconductor device which includes a resin-impregnated fibrous-body composite substrate including an insulating resin layer which is provided on both surfaces of a sheet-like fibrous body and with which the sheet-like fibrous body is impregnated, and a through wiring which is provided in a region surrounded by the insulating resin layer and formed using a conductive material. The conductive material is exposed on both surfaces of the insulating resin layer and the sheet-like fibrous body is impregnated with the conductive material. An integrated circuit chip having a bump exposed to a surface of an insulating layer is fixed to the semiconductor device. The bump of the integrated circuit chip is in close contact with the through wiring of the resin-impregnated fibrous-body composite substrate. The through wiring is formed so that the sheet-like fibrous body is impregnated with the conductive material. The sheet-like fibrous body remains in an entire region of the resin-impregnated fibrous-body composite substrate without any portion being removed; accordingly, the sheet-like fibrous body functions to maintain mechanical strength and airtightness.

Another embodiment of the present invention is a manufacturing method of a wiring substrate, including the steps of forming a through wiring by impregnating a region of a sheet-like fibrous body with a conductive resin and impregnating a region of the sheet-like fibrous body which is not impregnated with the conductive resin with an insulating resin layer.

Still another embodiment of the present invention is a manufacturing method of a semiconductor device including the steps of: forming an integrated circuit chip having a bump exposed to a surface of an insulating layer, forming a through wiring by impregnating a region of a sheet-like fibrous body with a conductive resin so as to be in contact with the bump, and impregnating a region of the sheet-like fibrous body which is not impregnated with the conductive resin with an insulating resin layer.

In a wiring substrate which uses a resin-impregnation fibrous-body composite material, even when a through wiring is provided, a strong wiring substrate capable of maintaining mechanical strength can be provided.

In the case where the resin-impregnated fibrous-body composite substrate provided with a through wiring is used as a sealing body of a semiconductor device, mechanical strength and air tightness can be maintained.

DETAILED DESCRIPTION OF THE INVENTION

Figure 1A:
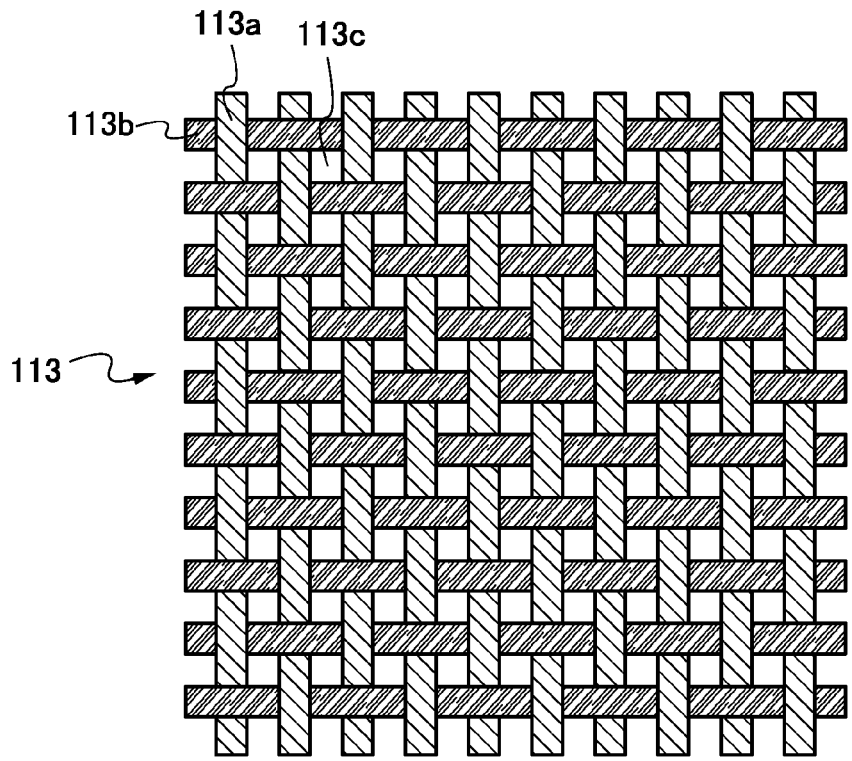
FIGS. 1A and 1B are top views of sheet-like fibrous bodies.

Hereinafter, embodiments of the present invention will be described with reference to the drawings. It is easily understood by those skilled in the art that modes and details herein disclosed can be modified in various ways without departing from the spirit and the scope of the present invention. Therefore, the present invention is not construed as being limited to description of the embodiments. Note that identical portions or portions having similar functions in the drawings are denoted by the same reference numerals and detailed descriptions thereof are omitted.

Note that in this specification, a semiconductor device refers to an element or a device in general which functions by utilizing a semiconductor. Electric devices including electric circuits, liquid crystal display devices, light-emitting devices, and the like and electronic devices on which the electric devices are mounted are included in the category of semiconductor devices.

Embodiment 1

In Embodiment 1, the structure of a wiring substrate and manufacturing methods thereof will be described with reference to FIGS. 1A and 1B and FIGS. 2A to 2D.

Figure 1B:
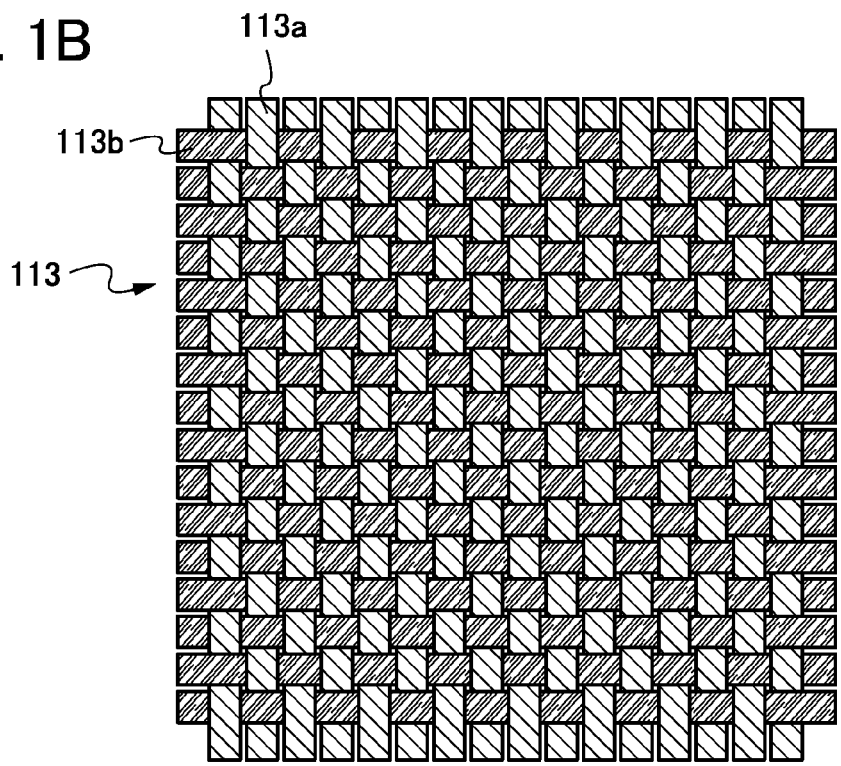

FIGS. 1A and 1B are each a top view of a sheet-like fibrous body 113 which is a fabric woven using yarn bundles for warp yarns and weft yarns.

The sheet-like fibrous body 113 is a woven fabric or a nonwoven fabric of an organic compound or an inorganic compound. Further, the sheet-like fibrous body 113 may be formed using a high-strength fiber.

The sheet-like fibrous body 113 may be formed using a woven fabric which is woven using bundles of fiber (single yarn) (hereinafter, referred to as yarn bundles) for warp yarns and weft yarns, or a nonwoven fabric obtained by stacking yarn bundles of plural kinds of fiber in a random manner or in one direction. In the case of a woven fabric, a plain-woven fabric, a twilled fabric, a satin-woven fabric, or the like can be appropriately used.

The yarn bundle may have a circular shape or an elliptical shape in cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which is subjected to fiber opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in cross section. Using a yarn bundle having an elliptical shape or a flat shape in cross section in this manner can reduce the thickness of the sheet-like fibrous body 113. Accordingly, the thickness of a structure body 120 (FIGS. 2C and 2D) can be made small, and a thin semiconductor device can be manufactured.

As illustrated in FIG. 1A, the sheet-like fibrous body 113 is woven using warp yarns 113a spaced at regular intervals and weft yarns 113b spaced at regular intervals. Such a fibrous body has a region without the warp yarns 113a and the weft yarns 113b (referred to as a basket hole 113c). In such a sheet-like fibrous body 113, the fibrous body is further impregnated with an organic resin such as an insulating resin or a conductive resin, whereby adhesiveness of the sheet-like fibrous body 113 can be further increased.

Alternatively, the density of the warp yarns 113a and the weft yarns 113b may be high and the proportion of the basket holes 113c may be low like the sheet-like fibrous body 113 illustrated in FIG. 1B. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. When the basket hole 113c of the sheet-like fibrous body 113 has such a small area, even when pressure is applied by a member with a sharp tip (typically, a writing material such as a pen or a pencil), the pressure can be absorbed by the entire sheet-like fibrous body 113.

Further, in order to enhance permeability of an organic resin into the inside of the yarn bundle, the yarn bundle may be subjected to surface treatment. For example, as the surface treatment, corona discharge, plasma discharge, or the like for activating a surface of the yarn bundle can be given. Further, surface treatment using a silane coupling agent or a titanate coupling agent can be given.

The high-strength fiber is specifically fiber with a high tensile modulus of elasticity or fiber with a high Young's modulus. As typical examples of high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, glass fiber using E glass, S glass, D glass, Q glass, or the like can be used. The sheet-like fibrous body 113 may be formed from one or more kinds of the above-described high-strength fibers.

Figure 2A:
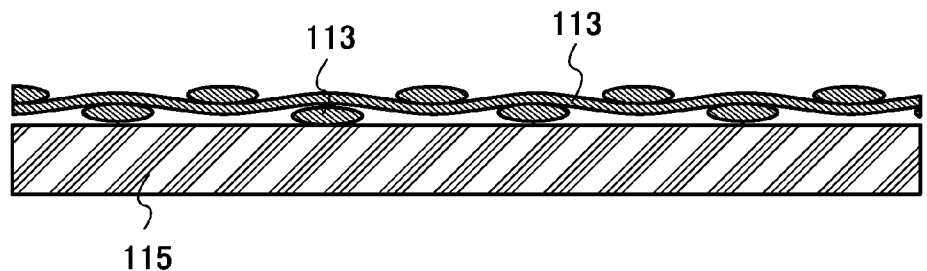
FIGS. 2A, 2B, 2C and 2D are cross-sectional views illustrating manufacturing methods of a wiring substrate.
Figure 2B:
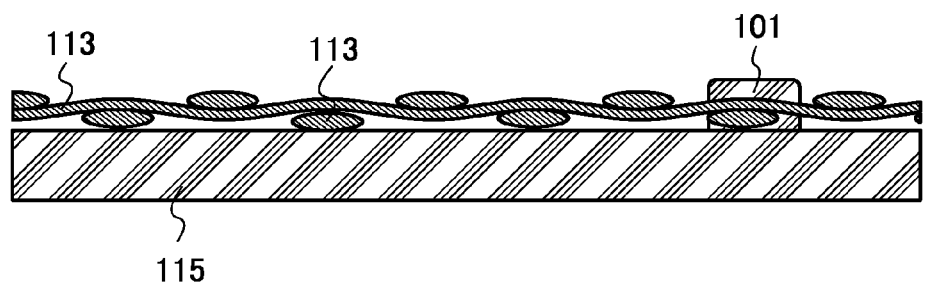
Figure 2C:
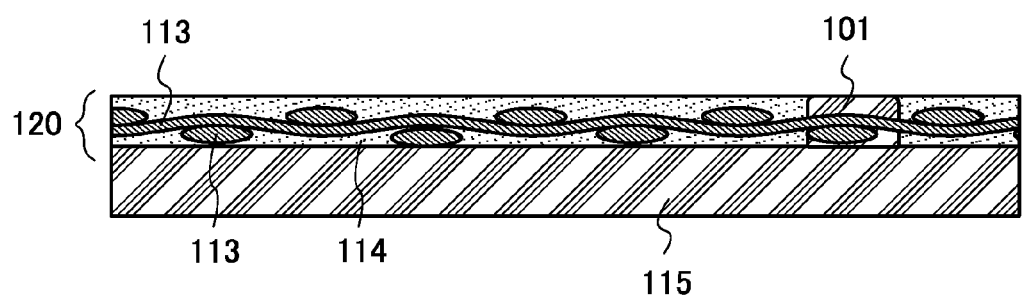

FIGS. 2A to 2C each illustrate a semiconductor element 115 and a structure body 120 in which electrical conduction is realized using a conductive resin 101 without a through-hole provided. Note that in this specification, part including the sheet-like fibrous body 113, an insulating resin 114, the conductive resin 101 is referred to as the structure body 120; however, the structure body 120 may be the one which does not include the conductive resin 101 and includes only the sheet-like fibrous body 113 and the insulating resin 114.

The sheet-like fibrous body 113 is impregnated with the conductive resin 101 (see FIG. 2B). In this embodiment, as the conductive resin 101, any of copper (Cu), silver (Ag), nickel (Ni), gold (Au), platinum (Pt), palladium (Pd), tantalum (Ta), molybdenum (Mo), and titanium (Ti) or a conductive paste including an organic resin is used. More specifically, silver paste is used as the conductive resin 101.

The conductive resin 101 serves as a through wiring. The conductive resin 101 may be processed to have various shapes in order to serve as a wiring.

Next, a region of the sheet-like fibrous body 113, which is not impregnated with the conductive resin 101, is impregnated with the insulating resin 114 (see FIG. 2C).

As the insulating resin 114, an organic resin may be used, and a thermosetting resin such as an epoxy resin, an unsaturated polyester resin, a polyimide resin, a bismaleimide-triazine resin, or a cyanate resin can be used, for example. Further, a thermoplastic resin such as a polyphenylene oxide resin, a polyetherimide resin, or a fluorine resin can be used. Furthermore, a plurality of the above-described thermosetting resins and thermoplastic resins may be used. When the above-described organic resin is used, the fibrous body can be firmly fixed to the element layer by thermal treatment. Note that the higher the glass transition temperature of the insulating resin 114 is, the less the insulating resin 114 is damaged by local pressing force, which is preferable.

Highly thermally-conductive filler may be dispersed in the insulating resin 114 or in the yarn bundles of fibers. As the highly thermally-conductive filler, an aluminum nitride, a bromine nitride, a silicon nitride, alumina, or the like can be given. As the highly thermally-conductive filler, a metal particle such as silver or copper can also be given. When the highly thermally-conductive filler is included in the organic resin or the yarn bundle, heat generated in the element layer can be easily released to the outside. Accordingly, thermal storage of the semiconductor device can be suppressed, and breakdown of the semiconductor device can be reduced.

As illustrated in FIG. 2C, a conductive region by which one surface of the structure body 120 can be electrically connected to the other surface can be formed without formation of a through hole (also referred to as a contact hole) in the structure body 120, that is, without division of the sheet-like fibrous body 113; accordingly, the strength of the structure body 120 can be maintained.

Figure 2D:
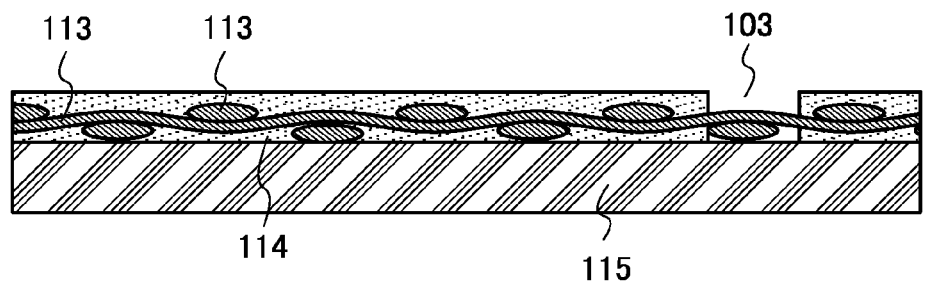

Alternatively, the insulating resin 114 may be formed in a region other than a region 103 which is to be electrically conductive as illustrated in FIG. 2D, and then the conductive resin 101 may be formed in the region 103 to obtain the structure illustrated in FIG. 2C.

The thus-formed resin-impregnated fibrous-body composite substrate can maintain mechanical strength and airtightness while including a through wiring.

Embodiment 2

In Embodiment 2, a structure of a semiconductor device using a resin-impregnated fibrous-body composite substrate which is provided with a through wiring, and a manufacturing method thereof will be described with reference to FIGS. 3A to 3D, FIGS. 4A to 4E, FIGS. 5A to 5D, and FIGS. 7A and 7B.

FIGS. 3A to 3D are cross-sectional views of element layers according to this embodiment.

An element layer 51 includes a thin film transistor 52a, a thin film transistor 52b, an insulating film 65, an insulating film 66, and an insulating film 67 over an insulating layer 56. The thin film transistor 52a includes a semiconductor layer including impurity regions 53a which are a source region and a drain region and a channel formation region 63a, a gate insulating layer 54, and a gate electrode 55a. The thin film transistor 52b includes a semiconductor layer including impurity regions 53b which are a source region and a drain region and a channel formation region 63b, the gate insulating layer 54, and a gate electrode 55b.

The impurity regions 53a of the thin film transistor 52a and the impurity regions 53b of the thin film transistor 52b each include an impurity element imparting one conductivity type. As an impurity element imparting n-type conductivity, phosphorus (P), arsenic (As), or the like may be used. As an impurity element imparting p-type conductivity, boron (B) or the like may be used. The impurity regions 53a and the impurity regions 53b may include different impurity elements imparting different conductivity types or the same impurity element imparting one conductivity type. In this embodiment, the impurity regions 53a include phosphorus (P) and are n-type impurity regions, and the impurity regions 53b include boron (B) and are p-type impurity regions. In other words, the thin film transistor 52a is an n-channel thin film transistor and the thin film transistor 52b is a p-channel thin film transistor.

In each of the thin film transistor 52a and the thin film transistor 52b, the semiconductor layer is a layer formed of non-single-crystal semiconductor having a thickness greater than or equal to 10 nm and less than or equal to 100 nm, and more preferably greater than or equal to 20 nm and less than or equal to 70 nm. As the non-single-crystal semiconductor layer, a crystalline semiconductor layer, an amorphous semiconductor layer, a microcrystalline semiconductor layer, or the like can be given. As the semiconductor, silicon, germanium, a silicon-germanium compound, or the like can be given. In particular, it is preferable to apply a crystalline semiconductor which is formed by crystallization through rapid thermal annealing (RTA) or thermal treatment using an annealing furnace, or a crystalline semiconductor which is formed by crystallization through heat treatment and laser beam irradiation. In the heat treatment, a crystallization method using a metal element such as nickel which can promote crystallization of silicon semiconductor can be used.

In the case of performing crystallization by laser beam irradiation in addition to heat treatment, crystallization can be performed by continuously moving a melted zone of the crystalline semiconductor, which is melted by irradiation with a continuous wave laser beam or a high-repetition-rate ultrashort pulsed laser beam having a repetition rate of 10 MHz or higher and a pulse width of 1 nanosecond or shorter, preferably in the range of 1 to 100 picoseconds inclusive, along the laser beam irradiation direction. By using such a crystallization method, a crystalline semiconductor having a large grain diameter with a crystal grain boundary extending in one direction can be obtained.

The gate insulating layer 54 is formed using an inorganic insulator such as a silicon oxide or a silicon oxynitride with a thickness greater than or equal to 5 nm and less than or equal to 50 nm, preferably greater than or equal to 10 nm and less than or equal to 40 nm.

The gate electrode 55a and the gate electrode 55b can be formed using metal, or a polycrystalline semiconductor to which an impurity element imparting one conductivity type is added. When using a metal, tungsten (W), molybdenum (Mo), titanium (Ti), tantalum (Ta), aluminum (Al), or the like can be used. Moreover, metal nitride obtained by nitriding metal can be used. Alternatively, a structure in which a first layer including the metal nitride and a second layer including the metal are stacked may be employed. At this time, by forming the first layer using metal nitride, the first layer can serve as a barrier metal. In other words, the metal of the second layer can be prevented from diffusing into the gate insulating layer or into the semiconductor layer that is provided in the lower than the gate insulating layer. In the case of employing a stacked structure, the gate electrode may have a shape in which the edge of the first layer extends beyond the edge of the second layer.

The thin film transistor 52a and the thin film transistor 52b which are formed by combination of the semiconductor layers, the gate insulating layer 54, the gate electrode 55a, the gate electrode 55b, and the like can have various structures such as a single drain structure, an LDD (lightly doped drain) structure, and a gate overlapped drain structure. Here, the thin film transistors have a single-drain structure. Alternatively, the thin film transistor can have a multi-gate structure which is equivalent to a plurality of transistors connected in series, to which the same gate voltage is applied, a dual gate structure where a semiconductor layer is interposed between gate electrodes, an inverted staggered structure where a gate electrode is formed over the insulating layer 56 and a gate insulating layer and a semiconductor layer are formed over the gate electrode, or the like.

Wirings 57a, 57b, 58a, and 58b which are in contact with the impurity regions 53a and the impurity regions 53b which are the source regions and the drain regions are preferably formed by combination of a low-resistance material such as aluminum (Al) and a barrier metal using a high-melting-point metal material such as titanium (Ti) or molybdenum (Mo), e.g., a stacked structure of titanium (Ti) and aluminum (Al) or a stacked structure of molybdenum (Mo) and aluminum (Al).

As the thin film transistor, a thin film transistor using a metal oxide or an organic semiconductor material for a semiconductor layer can be used. As typical examples of the metal oxide, a zinc oxide, an oxide of zinc gallium indium, and the like can be given.

A typical example of a semiconductor device including the element layer 51 is a microprocessor (MPU) which controls another device or performs calculation and processing of data. An MPU includes a CPU, a main memory, a controller, an interface, an I/O port, and the like, and each of them can be formed using a thin film transistor, a resistor, a capacitor, a wiring, or the like.

Figure 3A:
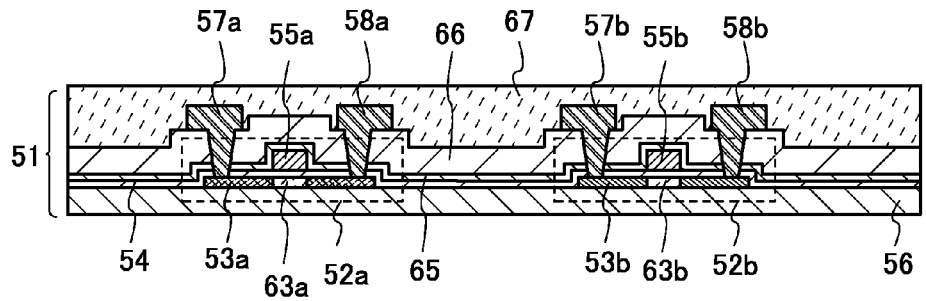
FIGS. 3A, 3B, 3C and 3D are cross-sectional views illustrating manufacturing methods of semiconductor devices.
Figure 3B:
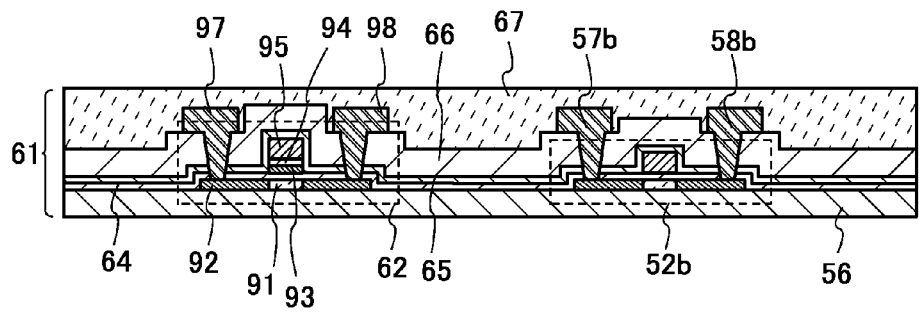

A memory element 62 illustrated in FIG. 3B is a nonvolatile memory element including a semiconductor layer including a channel formation region 91 and impurity regions 92, a tunnel oxide layer 64, a floating gate 93, a control insulating layer 94, and a control gate 95.

The tunnel oxide layer 64 can be formed from a silicon oxide or formed to have a stacked structure of a silicon oxide and a silicon nitride, with a thickness of 1 nm to 10 nm, preferably 1 nm to 5 nm, by a low pressure CVD method, a plasma CVD method, or the like. Further, the tunnel oxide layer can be formed by oxidizing or nitriding a semiconductor layer by plasma treatment. Furthermore, a silicon oxide formed by a plasma CVD method may be oxidized or nitrided by plasma treatment. An insulating layer formed by the plasma treatment is dense, has high withstand voltage, and is excellent in reliability.

The floating gate 93 can be formed using a conductive layer, a polysilicon layer, a silicon dot, or the like. Instead of the floating gate, a charge storage layer formed from a silicon nitride, a germanium nitride, or the like may be used.

The control insulating layer 94 is formed of a single layer or a plurality of layers of a silicon oxide, a silicon nitride, a silicon oxynitride, an aluminum oxide, or the like by a low pressure CVD method, a plasma CVD method, or the like. The control insulating layer 94 is formed to have a thickness of 1 nm to 20 nm, preferably 5 nm to 10 nm.

The control gate 95 may be formed using a material similar to that of the gate electrode 55a or the gate electrode 55b illustrated in FIG. 3A.

As a driving element for driving the memory element 62, a thin film transistor 52b may be formed.

After the memory element 62 and the thin film transistor 52b are formed, an insulating film 65 and an insulating film 66 are formed to cover the memory element 62 and the thin film transistor 52b. A wiring 97 and a wiring 98 are formed over the insulating film 66 so as to be electrically connected to the impurity regions 92. For the thin film transistor 52b, a wiring 57b and a wiring 58b as described above are formed. An insulating film 67 is formed to cover the insulating film 66, the wiring 97, the wiring 98, the wiring 57b, and the wiring 58b. Thus, an element layer 61 including the memory element 62 is formed.

Examples of the memory element include, in addition to the structure of the memory element 62, a nonvolatile memory element including a charge accumulation layer; a thin film transistor and a capacitor which is connected to the thin film transistor; a thin film transistor and a capacitor which is connected to the thin film transistor and includes a ferroelectric layer; an organic memory element in which an organic compound layer is interposed between a pair of electrodes; and the like.

As semiconductor devices having such a memory element, memory devices such as DRAM (dynamic random access memory), SRAM (static random access memory), FeRAM (ferroelectric random access memory), mask ROM (read only memory), EPROM (electrically programmable read only memory), EEPROM (electrically erasable and programmable read only memory), and flash memory can be given.

Figure 3C:
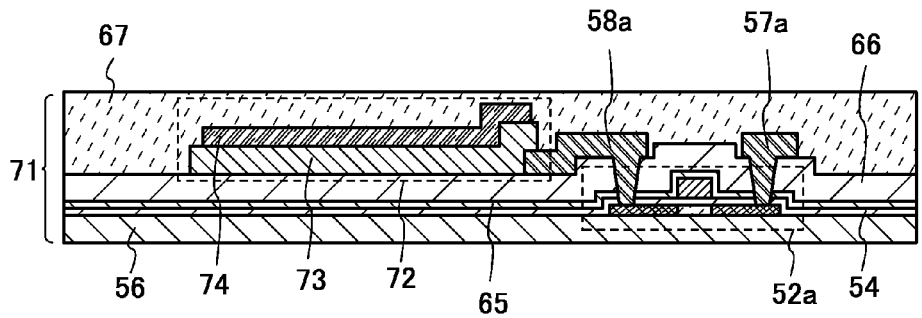

A photodiode 72 illustrated in FIG. 3C includes a wiring 58a functioning as a first electrode, a light receiving portion 73, and a second electrode 74. The light receiving portion 73 can be formed using a semiconductor layer containing amorphous or crystalline silicon. As typical examples of the semiconductor layer, a silicon layer, a silicon germanium layer, a silicon carbide layer, and a PN junction layer and a PIN junction layer of these layers can be given.

A thin film transistor 52a is electrically connected to the photodiode 72 through the wiring 58a and functions as a driving element. An insulating film 65 and an insulating film 66 are formed over the thin film transistor 52a. A wiring 57a and a wiring 58a are formed over the insulating film 66 so as to be electrically connected to impurity regions of the thin film transistor 52a. Further, the light receiving portion 73 which is electrically connected to the wiring 58a is formed over the insulating film 66 and the second electrode 74 is formed over the light receiving portion 73.

An insulating film 67 is formed to cover the insulating film 66, the wiring 57a, the wiring 58a, the light receiving portion 73, and the second electrode 74. Thus, an element layer 71 including the photodiode 72 and the thin film transistor 52a is formed.

As semiconductor devices including the photodiode 72 illustrated in FIG. 3C, an optical sensor, a solar cell, and the like can be given.

Figure 3D:
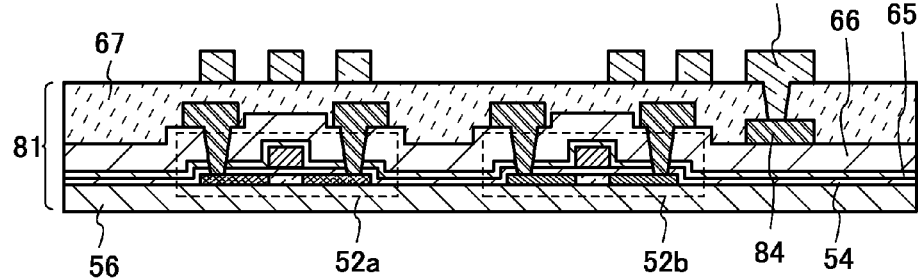

An element layer 81 illustrated in FIG. 3D includes a thin film transistor 52a, a thin film transistor 52b, an electrode 84 which is formed over an insulating film 66 and electrically connected to the thin film transistor 52a or 52b, and an antenna 83 which is formed over an insulating film 67 and electrically connected to the electrode 84. The electrode 84 may be formed using a material and a manufacturing method similar to those of a wiring 57a, a wiring 58a, a wiring 57b, or a wiring 58b which is electrically connected to the thin film transistor 52a or the thin film transistor 52b.

The antenna 83 illustrated in FIG. 3D is formed in such a manner that a droplet or paste which includes metal particles of one or more of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispenser method, or the like), and it is dried and baked. Formation of the antenna by a droplet discharge method enables the number of steps to be reduced, and cost can be reduced accordingly.

Further, the antenna 83 may be formed by a screen printing method. In the case of using a screen printing method, as a material for the antenna 83, a conductive paste where conductive particles having a particle size of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersible nanoparticles can be used. In addition, as the organic resin included in the conductive paste, one or a plurality of organic resins each functioning as a binder, a solvent, a dispersant, or a coating of the metal particle can be used. Typically, an organic resin such as an epoxy resin or a silicone resin can be used. Further, in forming the conductive layer, baking is preferably performed after the conductive paste is printed.

Alternatively, the antenna 83 may be formed using gravure printing or the like instead of a screen printing method or may be formed using a conductive material by a plating method, a sputtering method, or the like.

As typical examples of semiconductor devices including the element layer 81 illustrated in FIG. 3D, an ID tag, an IC tag, an RF (radio frequency) tag, a wireless tag, an electronic tag, an RFID (radio frequency identification) tag, an IC card, an ID card, and the like (hereinafter, referred to as an RFID), which can transmit and receive information wirelessly, can be given. Further, semiconductor devices of this embodiment include an inlet in which an integrated circuit portion including a thin film transistor and the like and an antenna are sealed; and the inlet formed into a sticker or card shape. Further, when the area of a top surface of the semiconductor device is greater than or equal to 4 mm$^2$, more preferably greater than or equal to 9 mm$^2$, the antenna can be formed to have a large area. Accordingly, an RFID with a long communication distance with a communication instrument can be obtained.

As a signal transmission method of an RFID, an electromagnetic coupling method or an electromagnetic induction method (e.g., 13.56 MHz band) is applied. In the case of utilizing electromagnetic induction caused by a change in magnetic flux density, the top view of the antenna can be a ring shape (e.g., a loop antenna) or a spiral shape (e.g., a spiral antenna).

Alternatively, a microwave method (e.g., a UHF band (860 to 960 MHz band), a 2.45 GHz band, or the like) can be employed as the signal transmission method of an RFID. In that case, the shape such as the length of the antenna may be appropriately determined in consideration of the wavelength of the electromagnetic wave used for the signal transmission.

Figure 7A:
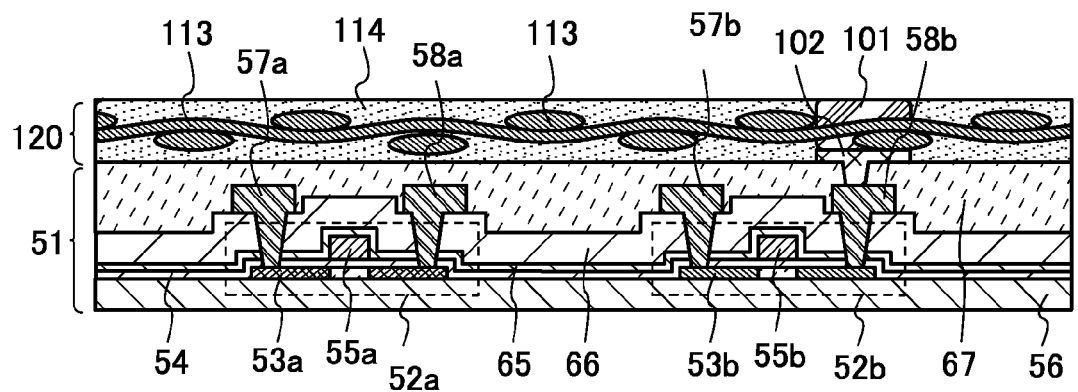
FIGS. 7A and 7B are cross-sectional views illustrating manufacturing methods of semiconductor devices.

FIG. 7A illustrates a structure in which a structure body 120 of this embodiment is applied to the element layer 51 including the thin film transistors 52a and 52b.

In FIG. 7A, the structure body 120 is provided so as to cover the element layer 51 including the thin film transistors 52a and 52b. The thin film transistor 52b can be electrically connected to an external terminal through the wiring 58b, a wiring 102, and a conductive resin 101.

Further, a structure body may be provided on the other surface of the element layer 51. In other words, both surfaces of the element layer 51 may each be provided with a structure body so that the element layer 51 is covered with a pair of facing structure bodies on both surfaces.

Figure 7B:
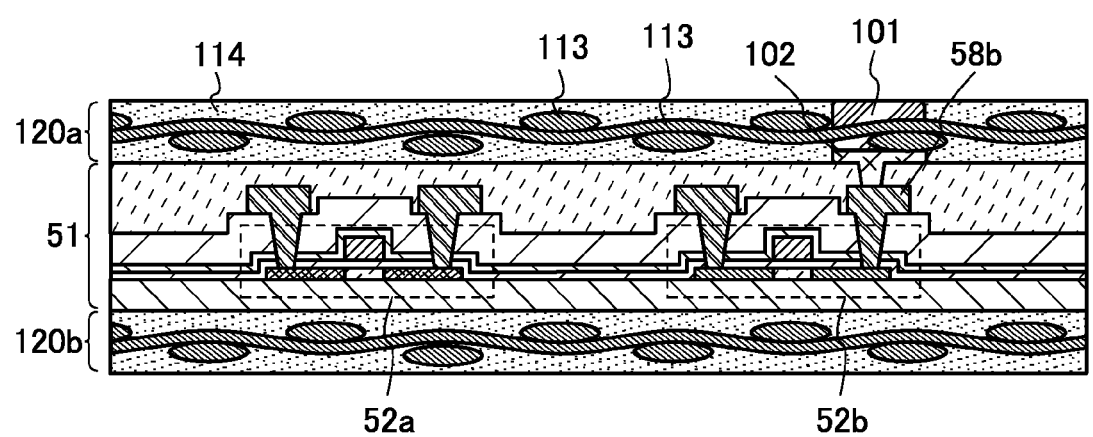

In the structure illustrated in FIG. 7B, one surface of the element layer 51 illustrated in FIG. 7A is provided with a structure body 120a and the other surface of the element layer 51 is provided with a structure body 120b. At this time, it is preferable that a fibrous body and an insulating organic resin of the structure body 120a have the properties same as those of the structure body 120b in order to reduce warpage. However, in the case of a use in which the front and the rear are distinguished from each other, it is not necessary that the structure bodies 120a and 120b are formed using materials having the same properties.

The organic resin with which the fibrous body is impregnated is firmly fixed in such a manner, whereby both surfaces of the element layer are supported by the fibrous bodies. Therefore, warpage of the entire semiconductor device can be reduced, which facilitates mounting of the semiconductor device including the element layer 51 on a laminate film, a sticker, or the like.

In the drawings of this specification, a sheet-like fibrous body 113 is illustrated as a woven which is plain-woven using a yarn bundle having an elliptical shape in cross section. Although the size of the thin film transistors 52a and 52b is larger than that of a yarn bundle of the sheet-like fibrous body 113, the size of the thin film transistors 52a and 52b may be smaller than that of a yarn bundle of the sheet-like fibrous body 113.

Next, a manufacturing method to obtain the structure illustrated in FIG. 7A will be described with reference to FIGS. 4A to 4E and FIGS. 5A to 5D.

Figure 4A:
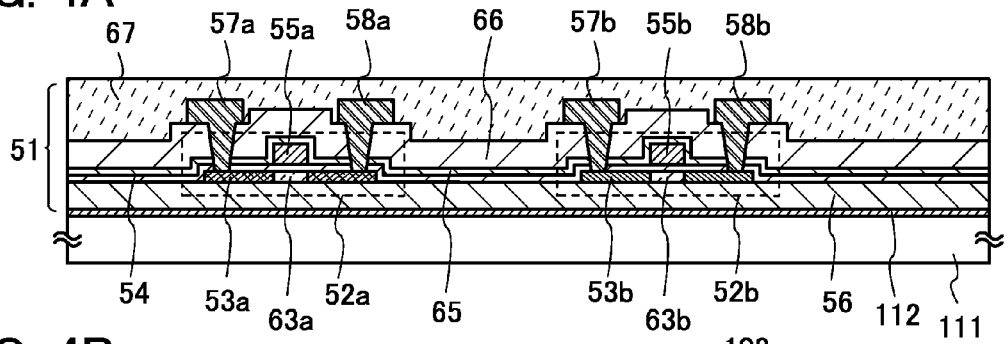
FIGS. 4A, 4B, 4C, 4D and 4E are cross-sectional views illustrating a manufacturing method of a semiconductor device.

As illustrated in FIG. 4A, a separation layer 112 is formed over a substrate 111 having an insulating surface. Then, the element layer 51 including the thin film transistor 52a and the thin film transistor 52b is formed over the separation layer 112.

As the substrate 111 having an insulating surface, a substrate which can withstand a temperature at which the element layer 51 is formed is preferably used. Typically, a glass substrate, a quartz substrate, a ceramic substrate, a metal substrate in which an insulating layer is formed over at least one surface, an organic resin substrate, or the like can be used. Here, a glass substrate is used as the substrate 111 having an insulating surface.

The separation layer 112 is formed in such a manner that a layer having a thickness of 30 nm to 200 nm and includes an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing any of the elements described above as its main component; or a compound containing any of the elements described above as its main component is formed by a sputtering method, a plasma CVD method, a coating method, a printing method, or the like to be a single layer or a laminate. The crystalline structure of a layer containing silicon may be any one of an amorphous structure, a microcrystalline structure, or a polycrystalline structure. Here, a coating method means a method by which a solution is discharged on an object to form a film, and includes a spin coating method and a droplet discharge method, for example. A droplet discharge method is a method of forming a predetermined pattern by discharging a droplet of a composition containing particulates from a small hole.

In the case where the separation layer 112 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds, for example, to an alloy of tungsten and molybdenum.

In the case where the separation layer 112 has a stacked structure, preferably, a metal layer is formed as a first layer, and a metal oxide layer is formed as a second layer. Typically, a layer containing tungsten, molybdenum, or a mixture of tungsten and molybdenum is formed as the first-layer metal layer. As the second layer, a layer containing an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is formed.

When the separation layer 112 has a stacked structure in which a metal layer is formed as the first layer and a metal oxide layer is formed as the second layer, the stacked structure may be formed by utilizing the following: a layer containing tungsten is formed as the metal layer, and an insulating layer formed of an oxide is formed thereover, whereby a layer containing an oxide of tungsten is formed as the metal oxide layer at the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizing power such as ozone water, or the like.

Examples of an oxide of tungsten include $WO_2$, $W_2O_5$, $W_4O_{11}$, $WO_3$, and the like.

Although the separation layer 112 is formed to be in contact with the substrate 111 having an insulating surface according to the above process, the present invention is not limited to this process. An insulating layer to be a base may be formed so as to be in contact with the substrate 111 having an insulating surface, and the separation layer 112 may be provided to be in contact with the insulating layer. Here, as the separation layer 112, a tungsten layer with a thickness of 30 nm to 70 nm is formed by a sputtering method.

An insulating layer 56 serving as a base layer is formed between the separation layer 112 and the thin film transistors 52a and 52b.

Figure 4B:
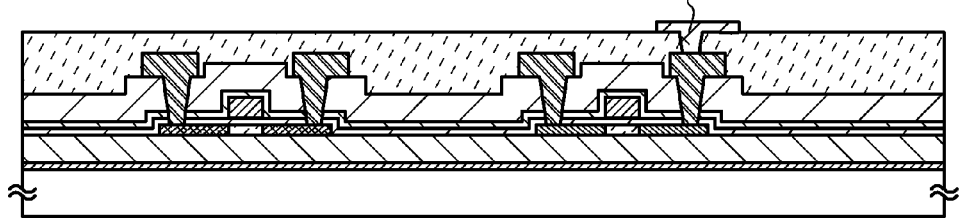

Next, the wiring 102 which is electrically connected to the wiring 58b is formed over the insulating film 67 (see FIG. 4B). The wiring 102 may be formed using a material similar to that of the wiring 58b. The wiring 102 is also referred to as a bump and has a function of electrically connecting the element layer 51 to the conductive resin 101 to be formed later.

Figure 4C:
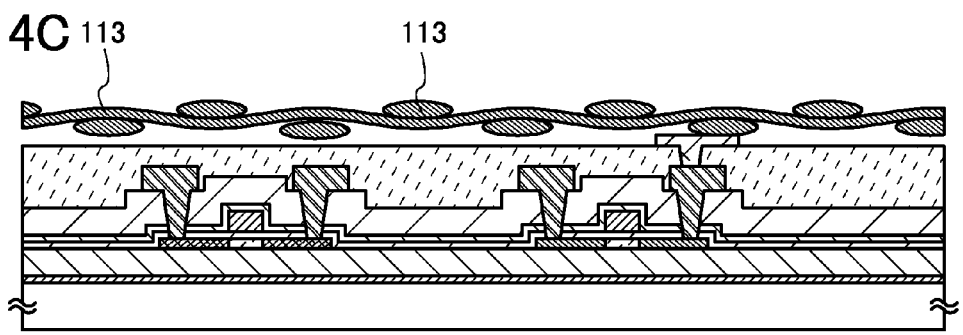

Then, the sheet-like fibrous body 113 is provided to cover the insulating film 67 and the wiring 102 (see FIG. 4C).

Figure 4D:
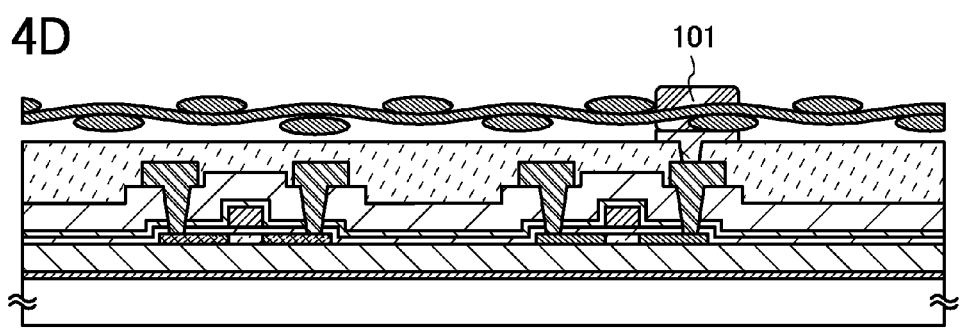

Next, a region of the sheet-like fibrous body 113 over the wiring 102 is impregnated with the conductive resin 101 (see FIG. 4D).

Figure 4E:
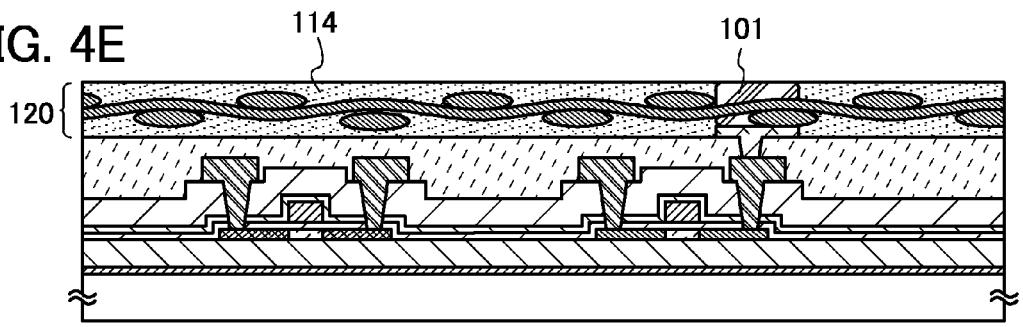

After impregnation with the conductive resin 101, the other region of the sheet-like fibrous body 113 is impregnated with the insulating resin 114 (see FIG. 4E).

Next, the structure body 120 is heated and pressure-bonded so that the insulating resin 114, or the conductive resin 101 and the insulating resin 114 of the structure body 120 are plasticized or cured. In the case where the insulating resin 114 is an organic plastic resin, the insulating resin 114 which is plasticized is then cured by cooling to room temperature.

The insulating resin 114 uniformly spreads over surfaces of the insulating film 67 and the wiring 102 and is cured by heating and pressure bonding. Thus, the sheet-like fibrous body 113 is impregnated with the insulating resin 114 and the structure body 120 is firmly fixed to one side of the insulating film 67 and one side of the wiring 102. A step of pressure-bonding the structure body 120 is performed under an atmospheric pressure or a reduced pressure.

Alternatively, the insulating resin 114 may be cured in the following manner: first heating is performed after the sheet-like fibrous body 113 is impregnated with the conductive resin 101, and the sheet-like fibrous body 113 is impregnated with the insulating resin 114, and then second heating is performed.

Note that in a manner similar to that of FIG. 2D, the sheet-like fibrous body 113 may be impregnated with the insulating resin 114 in a region other than a region to be electrically conductive, and then the sheet-like fibrous body 113 may be impregnated with the conductive resin 101 in the region to be electrically conductive.

Figure 5A:
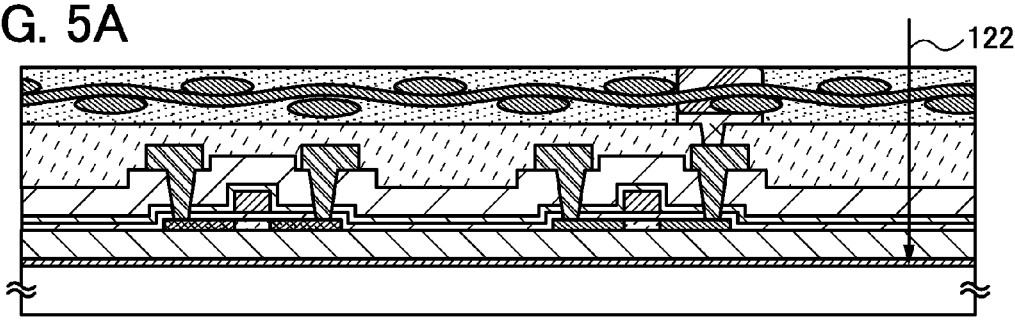
FIGS. 5A, 5B, 5C and 5D are cross-sectional views illustrating a manufacturing method of a semiconductor device.
Figure 5B:
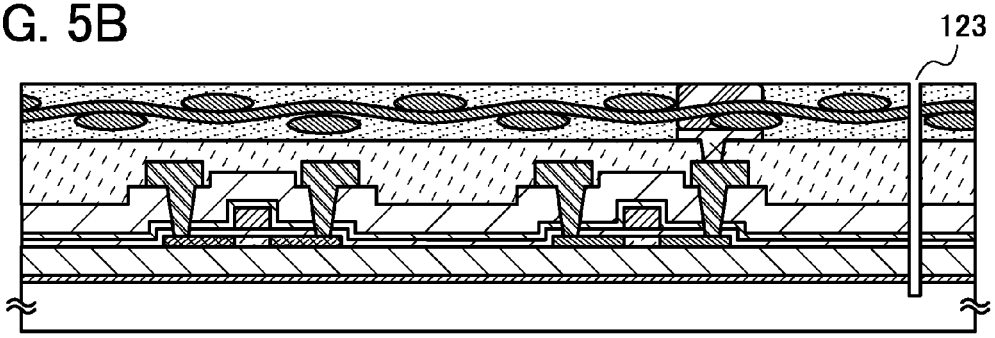

Next, in order to facilitate a subsequent separation step, a groove 123 as illustrated in FIG. 5B may be formed by irradiating the structure body 120, the element layer 51, and the separation layer 112 with a laser beam 122 from the side of the structure body 120 as illustrated in FIG. 5A. As the laser beam used for forming the groove 123, a laser beam with a wavelength which is absorbed by any of layers included in the separation layer 112, the element layer 51, or the structure body 120 is preferably used. Typically, a laser beam in the ultraviolet region, visible region, or infrared region is appropriately selected for irradiation.

As a laser capable of emitting such a laser beam, the following can be used: an excimer laser such as a KrF excimer laser, an ArF excimer laser, or a XeCl excimer laser; a gas laser such as a He laser, a He—Cd laser, an Ar laser, a He—Ne laser, an HF laser, or a $CO_2$ laser; a solid-state laser such as a crystal laser in which a crystal such as YAG, $GdVO_4$, $YVO_4$, YLF, or $YAlO_3$ is doped with Cr, Nd, Er, Ho, Ce, Co, Ti, or Tm, a glass laser, or a ruby laser; or a semiconductor laser such as a GaN laser, a GaAs laser, a GaAlAs laser, or an InGaAsP laser can be used. In a case of using a solid-state laser, any of the fundamental wave to the fifth harmonic wave is preferably used as appropriate.

Figure 5C:
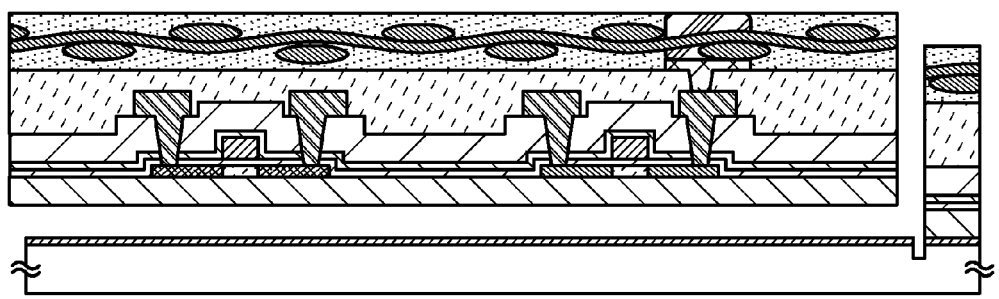
Figure 5D:
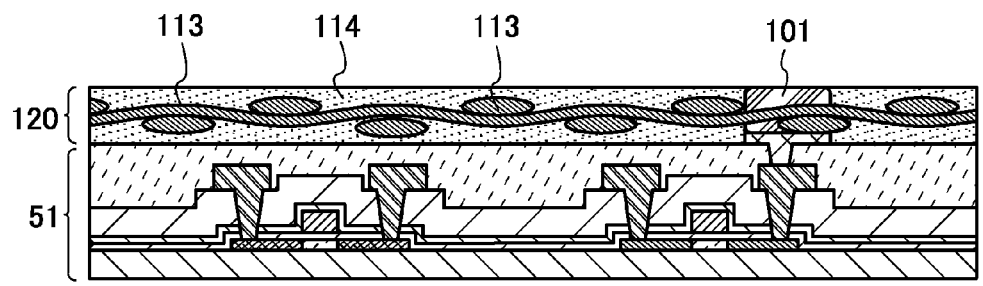

Next, as illustrated in FIG. 5C, by using the groove 123 as a trigger, the substrate 111 having an insulating surface over which the separation layer 112 is formed and part of the element layer 51 are separated from each other by physical means at the interface between the separation layer 112 and the insulating layer 56.

The physical means refers to dynamic means or mechanical means, which applies some dynamical energy (mechanical energy). Typically, the physical means is an action of applying mechanical force (e.g., a peeling process with human hands or with a gripper, or a separation process by rotating a roller). At this time, when an adhesive sheet which can be separated by light or heat is provided over a surface of the structure body 120, separation can be performed more easily.

Further, the element layer 51 may be separated from the separation layer 112 after a liquid is dropped into the groove 123 to allow the liquid to be infiltrated into the interface between the separation layer 112 and the insulating layer 56. In this case, a liquid may be dropped only into the groove 123, or the substrate 111 having an insulating surface, the element layer 51, and the structure body 120 may be wholly soaked in a liquid so that the liquid may be infiltrated from the groove 123 into the interface between the separation layer 112 and the element layer 51.

Alternatively, in FIG. 5B, a method can be employed in which a fluoride gas such as $NF_3$, $BrF_3$, or $ClF_3$ is introduced into the groove 123, and the separation layer is removed by etching with the use of the fluoride gas so that part of the element layer 51 is separated from the substrate 111 having an insulating surface.

In the above-described manner, a semiconductor device can be obtained in which the element layer 51 formed in contact with one surface of the structure body 120 is electrically connected to a terminal, a wiring, a circuit, another semiconductor element, or the like formed on the other surface of the structure body 120 without forming a through hole in the structure body 120.

In the case where a plurality of semiconductor devices are included in the element layer 51, the plurality of semiconductor devices may be obtained by dividing the element layer 51 and the structure body 120. With such a step, a plurality of semiconductor devices can be manufactured.

When the element layer 51 and the structure body 120 are divided to obtain a plurality of semiconductor devices, selective division is possible by dicing, scribing, using a cutting machine having an edged tool such as scissors or a knife, laser cutting, or the like.

In the case where the resin-impregnated fibrous-body composite substrate provided with a through wiring as described above is used as a sealing body or a protective material of a semiconductor device, mechanical strength and airtightness can be maintained.

Example 1

The prepreg of Example 1 was manufactured in the following manner: a conductive resin was printed on a glass cloth, heating was performed, an insulating resin was printed, and then heating was performed.

As the conductive resin, silver paste including silver powder, 2-(2-butoxyethoxy)ethyl acetate, and an epoxy resin was used. As the insulating resin, an insulating resin including an epoxy resin and an amine curing agent was used.

Figure 6A:
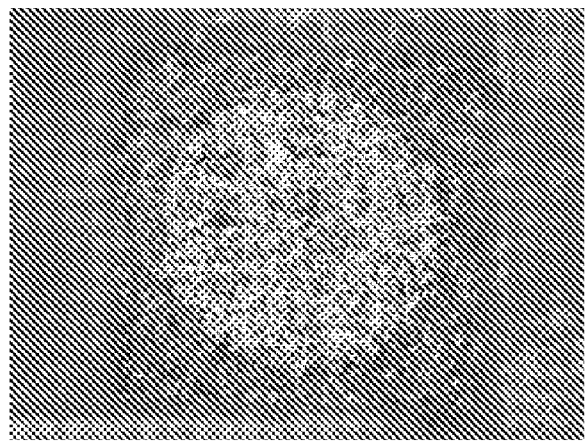
FIGS. 6A and 6B are optical micrographs of a conductive resin and a fibrous body.
Figure 6B:
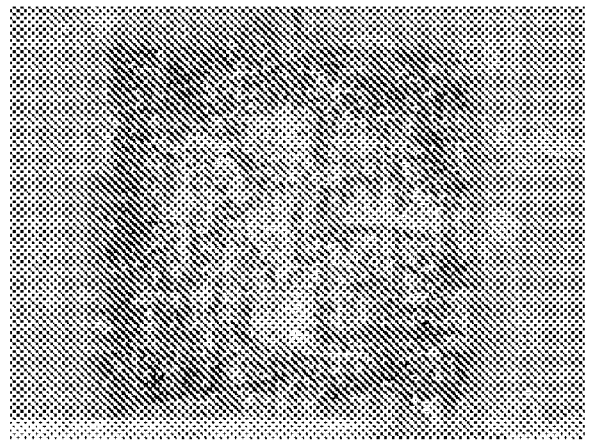

FIG. 6A shows an optical micrograph of the thus-formed prepreg seen from the side on which the conductive resin is printed. FIG. 6B shows an optical micrograph seen from the rear side.

As shown in FIG. 6A, the conductive resin and the insulating resin were arranged without being mixed with each other.

In addition, it is seen from FIG. 6B that the conductive resin has gone through the glass cloth and is exposed on the rear surface.

This application is based on Japanese Patent Application serial no. 2008-151227 filed with Japan Patent Office on Jun. 10, 2008, the entire contents of which are hereby incorporated by reference.

What is claimed is:

1. A wiring substrate comprising:
    an insulating resin layer provided on top and bottom surfaces of a sheet-like fibrous body, the sheet-like fibrous body impregnated with the insulating resin layer; and
    a wiring surrounded by the insulating resin layer, the wiring comprising a conductive material,
    wherein a portion of the sheet-like fibrous body is positioned in the wiring,
    wherein the wiring is exposed on both surfaces of the insulating resin layer,
    wherein the wiring is in contact with a part of the top surface of the sheet-like fibrous body, and
    wherein the portion of the sheet-like fibrous body is impregnated with the conductive material.

2. The wiring substrate according to claim 1, wherein the sheet-like fibrous body includes an organic compound.

3. The wiring substrate according to claim 1, wherein the sheet-like fibrous body is formed of a woven fabric comprising bundles of fiber for warp yarns and weft yarns.

4. The wiring substrate according to claim 1, wherein the sheet-like fibrous body comprises fiber selected from the group consisting of polyvinyl alcohol fiber, polyester fiber, polyamide fiber, polyethylene fiber, aramid fiber, polyparaphenylene benzobisoxazole fiber, glass fiber, and carbon fiber.

5. The wiring substrate according to claim 1, wherein the conductive material comprises at least one of copper, silver, nickel, gold, platinum, palladium, tantalum, molybdenum, and titanium.

6. A manufacturing method of a wiring substrate, comprising the steps of:
    impregnating a first region of a sheet-like fibrous body with a conductive resin, whereby forming a wiring, the wiring penetrating the sheet-like fibrous body; and
    impregnating a second region of the sheet-like fibrous body with an insulating resin layer, the second region surrounding the first region,
    wherein a portion of the sheet-like fibrous body is positioned in the wiring, and
    wherein the wiring is exposed on both surfaces of the insulating resin layer.

7. The manufacturing method of a wiring substrate according to claim 6, wherein the sheet-like fibrous body includes an organic compound.

8. The manufacturing method of a wiring substrate according to claim 6, wherein the sheet-like fibrous body is formed of a woven fabric comprising bundles of fiber for warp yarns and weft yarns.

9. The manufacturing method of a wiring substrate according to claim 6, wherein the sheet-like fibrous body comprises fiber selected from the group consisting of polyvinyl alcohol fiber, polyester fiber, polyamide fiber, polyethylene fiber, aramid fiber, polyparaphenylene benzobisoxazole fiber, glass fiber, and carbon fiber.

10. The manufacturing method of a wiring substrate according to claim 6, wherein the conductive resin comprises at least one of copper, silver, nickel, gold, platinum, palladium, tantalum, molybdenum, and titanium.

11. A semiconductor device comprising:
    a resin-impregnated fibrous-body composite substrate including:
        an insulating resin layer provided on top and bottom surfaces of a sheet-like fibrous body, the sheet-like fibrous body impregnated with the insulating resin layer; and
        a first wiring surrounded by the insulating resin layer, the first wiring comprising a conductive material,
        wherein a portion of the sheet-like fibrous body is positioned in the first wiring,
        wherein the first wiring is exposed on both surfaces of the insulating resin layer,
        wherein the first wiring is in contact with a part of the top surface of the sheet-like fibrous body, and
        wherein the portion of the sheet-like fibrous body is impregnated with the conductive material; and
    an integrated circuit chip including:
        a thin film transistor;
        an insulating layer over the thin film transistor; and
        a second wiring on the insulating layer,
    wherein the integrated circuit chip is in close contact with the resin-impregnated fibrous-body composite substrate so that the second wiring is in contact with the first wiring.

12. The semiconductor device according to claim 11, wherein the sheet-like fibrous body includes an organic compound.

13. The semiconductor device according to claim 11, wherein the sheet-like fibrous body is formed of a woven fabric comprising bundles of fiber for warp yarns and weft yarns.

14. The semiconductor device according to claim 11, wherein the sheet-like fibrous body comprises fiber selected from the group consisting of polyvinyl alcohol fiber, polyester fiber, polyamide fiber, polyethylene fiber, aramid fiber, polyparaphenylene benzobisoxazole fiber, glass fiber, and carbon fiber.

15. The semiconductor device according to claim 11, wherein the conductive material comprises at least one of copper, silver, nickel, gold, platinum, palladium, tantalum, molybdenum, and titanium.

16. A manufacturing method of a semiconductor device comprising the steps of:
    forming a thin film transistor;
    forming an insulating layer over the thin film transistor;
    forming a second wiring on the insulating layer;
    impregnating a first region of a sheet-like fibrous body with a conductive resin, whereby forming a first wiring, the first wiring being in contact with the second wiring, the first wiring penetrating the sheet-like fibrous body; and
    impregnating a second region of the sheet-like fibrous body with an insulating resin layer, the second region surrounding the first region,
    wherein a portion of the sheet-like fibrous body is positioned in the first wiring, and
    wherein the first wiring is exposed on both surfaces of the insulating resin layer.

17. The manufacturing method of a semiconductor device according to claim 16, wherein the sheet-like fibrous body includes an organic compound.

18. The manufacturing method of a semiconductor device according to claim 16, wherein the sheet-like fibrous body is formed of a woven fabric comprising bundles of fiber for warp yarns and weft yarns.

19. The manufacturing method of a semiconductor device according to claim 16, wherein the sheet-like fibrous body comprises fiber selected from the group consisting of polyvinyl alcohol fiber, polyester fiber, polyamide fiber, polyethylene fiber, aramid fiber, polyparaphenylene benzobisoxazole fiber, glass fiber, and carbon fiber.

20. The manufacturing method of a semiconductor device according to claim 16, wherein the conductive resin comprises at least one of copper, silver, nickel, gold, platinum, palladium, tantalum, molybdenum, and titanium.

* * * * *